(12) United States Patent
Raj et al.

(10) Patent No.: US 8,982,563 B2
(45) Date of Patent: Mar. 17, 2015

(54) CHIP PACKAGE TO SUPPORT HIGH-FREQUENCY PROCESSORS

(75) Inventors: Kannan Raj, San Diego, CA (US); Ivan Shubin, San Diego, CA (US); John E. Cunningham, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 293 days.

(21) Appl. No.: 13/171,072

(22) Filed: Jun. 28, 2011

(65) Prior Publication Data

US 2013/0003310 A1 Jan. 3, 2013

(51) Int. Cl.
- H05K 7/20 (2006.01)
- H05K 7/10 (2006.01)
- H01L 25/18 (2006.01)
- H01L 23/538 (2006.01)

(52) U.S. Cl.
CPC .............. *H05K 7/1092* (2013.01); *H01L 25/18* (2013.01); *H01L 23/5384* (2013.01); *H01L 2224/16225* (2013.01); *H01L 2224/73253* (2013.01); *H01L 2924/15311* (2013.01); *H01L 2924/10253* (2013.01)
USPC ........... 361/718; 361/694; 361/695; 361/704; 361/715; 361/721

(58) Field of Classification Search
USPC .................. 361/721, 694, 695, 704, 715, 718
See application file for complete search history.

(56) References Cited

U.S. PATENT DOCUMENTS

| | | | | |
|---|---|---|---|---|
| 6,014,313 A * | 1/2000 | Hesselbom | ............... | 361/704 |
| 6,304,450 B1 * | 10/2001 | Dibene et al. | ................ | 361/704 |
| 6,452,113 B2 * | 9/2002 | Dibene et al. | ................ | 174/260 |
| 6,611,435 B2 * | 8/2003 | Kumar et al. | ................ | 361/807 |
| 6,807,061 B1 * | 10/2004 | Harris | ............. | 361/719 |
| 6,837,719 B2 * | 1/2005 | Panella | ............. | 439/67 |
| 6,922,340 B2 * | 7/2005 | Belady et al. | ................ | 361/719 |
| 7,064,955 B2 * | 6/2006 | Harris et al. | ................ | 361/695 |
| 7,068,515 B2 * | 6/2006 | Harris et al. | ................ | 361/709 |
| 7,072,185 B1 * | 7/2006 | Belady et al. | ................ | 361/704 |
| 7,791,889 B2 * | 9/2010 | Belady et al. | ................ | 361/721 |
| 8,018,738 B2 * | 9/2011 | Doblar et al. | ................ | 361/803 |
| 2002/0152425 A1 * | 10/2002 | Chaiken et al. | ................ | 714/23 |
| 2003/0198033 A1 * | 10/2003 | Panella et al. | ................ | 361/760 |
| 2005/0022054 A1 * | 1/2005 | Rasmussen et al. | ............ | 714/10 |
| 2006/0109623 A1 * | 5/2006 | Harris et al. | ................ | 361/690 |
| 2009/0296360 A1 * | 12/2009 | Doblar et al. | ................ | 361/767 |
| 2011/0042795 A1 * | 2/2011 | Knickerbocker | ............. | 257/686 |

* cited by examiner

*Primary Examiner* — Anatoly Vortman

(74) *Attorney, Agent, or Firm* — Park, Vaughan, Fleming & Dowler LLP; Steven E. Stupp (57) ABSTRACT

A chip package includes a processor, an interposer chip and a voltage regulator module (VRM). The interposer chip is electrically coupled to the processor by first electrical connectors proximate to a surface of the interposer chip. Moreover, the interposer chip includes second electrical connectors proximate to another surface of the interposer chip, which are electrically coupled to the first electrical connectors by through-substrate vias (TSVs) in the interposer chip. Note that the second electrical connectors can electrically couple the interposer chip to a circuit board. Furthermore, the VRM is electrically coupled to the processor by the interposer chip, and is proximate to the processor in the chip package, thereby reducing voltage droop. For example, the VRM may be electrically coupled to the surface of the interposer chip, and may be adjacent to the processor. Alternatively, the VRM may be electrically coupled to the other surface of the interposer chip.

18 Claims, 7 Drawing Sheets

CHIP PACKAGE TO SUPPORT HIGH-FREQUENCY PROCESSORS

BACKGROUND

1. Field

The present disclosure generally relates to a chip package. More specifically, the present disclosure relates to a chip package that includes a voltage regulator module (VRM) that is electrically coupled to a proximate processor by an interposer chip that includes through-substrate vias (TSVs).

2. Related Art

Semiconductor process technology continues to scale to smaller critical dimensions and commensurately higher integrated-circuit densities. These trends are enabled by continuous advancements in front-end-of-line processing technologies and in chip-packaging technologies that leverage advances in the back-end-of-line technologies. In addition, technological progress is being sustained by advances in chip multi-threading and multi-core processor designs.

Given these trends, current semiconductor-industry roadmaps indicate that within a decade: the clock speed of the processor will approach 10 GHz; static currents in the processor core will increase to 250 A; the dynamic-current slew rate will increase to 250 A/ns; and the processor-core voltage will decrease to 0.7 V. This predicted rapid advancement in semiconductor process technology in conjunction with unbalanced loading of processors (which is associated with switching between multiple processor cores) is expected to pose very difficult challenges in processor power management, such as efficient power delivery and accurate voltage regulation.

In particular, processor performance is expected to be increasingly limited by transient power demands. For example, power-supply noise (which is sometimes referred to as 'voltage-droop noise' or 'voltage droop') is proportional to the maximum rate of change in current, $$\frac{di}{dt}.$$

Because the incremental current di increases and the time scale dt decreases with each new generation of processors, the power-supply noise is expected to increase significantly. Consequently, it will be increasingly difficult for associated voltage regulators to meet this challenge.

Hence, what is needed is a chip package that does not suffer from the above-described problems.

SUMMARY

One embodiment of the present disclosure provides a chip package that includes a processor, an interposer chip and a voltage regulator module (VRM). The interposer chip is electrically coupled to a first surface of the processor by first electrical connectors proximate to a first surface of the interposer chip. Moreover, the interposer chip includes second electrical connectors proximate to a second surface of the interposer chip. The interposer chip also includes through-substrate vias (TSVs) electrically coupling the first electrical connectors to the second electrical connectors. Note that the second electrical connectors can electrically couple the interposer chip to a circuit board. Furthermore, the VRM is electrically coupled to the processor by the interposer chip, and is proximate to the processor in the chip package, thereby reducing voltage droop.

In some embodiments, the VRM is electrically coupled to the first surface of the interposer chip, and the VRM is adjacent to the processor. Alternatively, the VRM may be electrically coupled to the second surface of the interposer chip.

Furthermore, the chip package may include a thermal cooling mechanism thermally coupled to a second surface of the processor, which is on an opposite side of the processor from the first surface of the processor.

Additionally, the circuit board may be electrically coupled to the second electrical connectors. This circuit board may include at least one of an organic substrate or a ceramic substrate. Moreover, the interposer chip may include a semiconductor substrate, such as silicon.

Note that the VRM may include a transient VRM. In some embodiments, the VRM includes an array of VRMs, the processor includes multiple processor cores, and the VRMs in the array of VRMs independently regulates the power to different subsets of the processor cores.

In some embodiments, the interposer chip is a passive device that excludes integrated active circuits.

Another embodiment provides a system (such as an electronic device) that includes the chip package. This system may or may not include the processor.

Another embodiment provides a method for regulating power to the processor, which may be performed by the chip package. During the method, power signals are electrically coupled from the VRM to the processor. This VRM is located proximate to the processor in the chip package, and is electrically coupled to the processor by the interposer chip that includes TSVs between the first electrical connectors on the first surface of the interposer chip and the second electrical connectors on the second surface of the interposer chip. Moreover, the second electrical connectors can electrically couple the interposer chip to a circuit board. Then, during operation of the processor, the power signals supplied to the processor may be regulated using the VRM, thereby reducing the voltage droop.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

Embodiments of a chip package, a system that includes the chip package and a technique for regulating power to a processor are described. This chip package includes a processor, an interposer chip and a voltage regulator module (VRM). The interposer chip is electrically coupled to the processor by first electrical connectors proximate to a surface of the interposer chip. Moreover, the interposer chip includes second electrical connectors proximate to another surface of the interposer chip, which are electrically coupled to the first electrical connectors by through-substrate vias (TSVs) in the interposer chip. Note that the second electrical connectors can electrically couple the interposer chip to a circuit board. Furthermore, the VRM is electrically coupled to the processor by the interposer chip, and is proximate to the processor in the chip package, thereby reducing voltage droop. For example, the VRM may be electrically coupled to the surface of the interposer chip, and may be adjacent to the processor. Alternatively, the VRM may be electrically coupled to the other surface of the interposer chip.

This chip package may provide: improved power regulation accuracy, higher efficiency, and faster transient response for improved transient voltage regulation. Consequently, the chip package may facilitate high-frequency operation of the processor.

Figure 1:
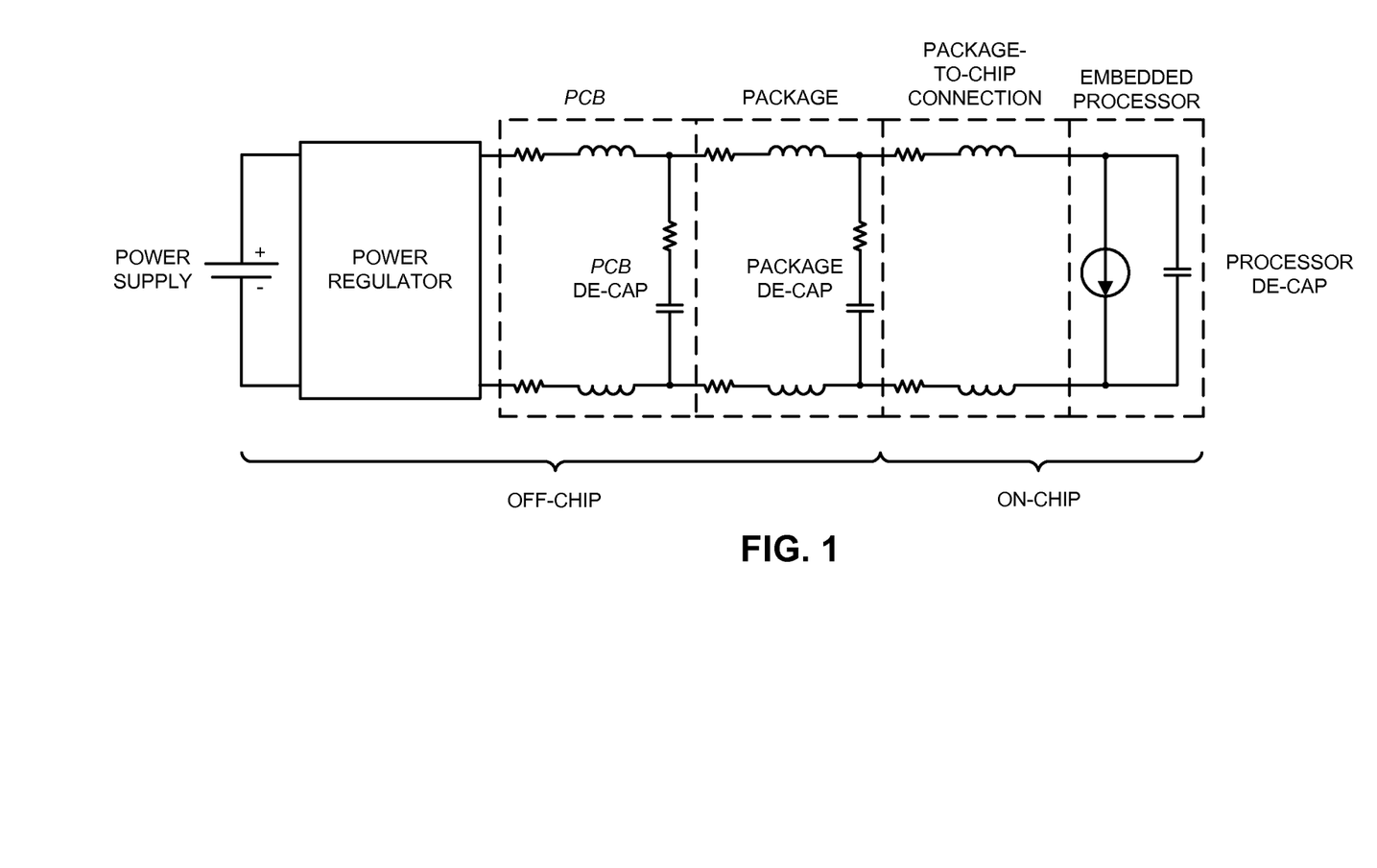
FIG. 1 is a block diagram illustrating a voltage-regulation technique for use with a processor in accordance with an embodiment of the present disclosure.

We now describe embodiments of the chip package. FIG. 1 presents a block diagram illustrating a voltage-regulation technique for use with a processor. In this voltage-regulation technique, a voltage-regulation path includes a printed-circuit-board (PCB) trace, a processor socket, an interposer layer, a ball-grid-array (BGA) interconnect and a land-grid-array (LGA) interconnect. Parasitics associated with these interconnects (which are sometimes referred to as 'packaging parasitics') typically result in a large voltage droop. Moreover, this voltage droop is expected to be significantly increased for the next generation of processors such that it may be difficult to achieve the desired output-voltage regulation window. As a consequence, packaging parasitics may need to be decreased by an order of magnitude in order to meet the design requirements for clean power delivery in these processors.

In general, transient processor power-supply noise (such as voltage droop and overshoot) can be divided or segmented into three different time domains. The so-called third-droop and overshoot events, which are associated with time scales longer than 1 μs, occur at the node between the VRM and the motherboard, and at the node between the motherboard and the processor socket. Typically, the third droop is controlled by the filter capacitors and the control loop in the VRM. The so-called second droop and overshoot, which are associated with time scales ranging from 10-100 ns, occur at the node between the processor socket and the processor package. The second droop is usually controlled by package capacitors.

The so-called first droop and overshoot, which are associated with time scales less than 10 ns, occur at the node between the processor package and the processor. The first droop is typically controlled by on-chip capacitance and a transient VRM, such as Gigahertz transient VRMs. These transient VRMs reduce the amplitude of high-frequency transient events, such as the first and second droop and overshoot). In this voltage-regulation technique, a Megahertz VRM delivers the average power to the processor, while a Gigahertz VRM delivers the transient power with a response speed of several ns.

Note that a capacitor alone usually cannot provide the necessary instantaneous charge to satisfy the very fast switching events on the processor die. In addition, there is typically a die-area limit as to how much capacitance can be placed on a given processor die. Therefore, the transient-regulation task is often more effective when an off-die Gigahertz transient VRM chip is used. These Gigahertz transient VRMs are typically based on silicon-germanium Bi-CMOS technology with peak frequencies that are more than 10-20× the processor speed. As a consequence, Gigahertz transient VRMs often need to be located in close proximity to the processor to minimize the amount of parasitic inductance between the transient VRM and the processor.

Advanced packaging technologies can help to improve the efficiency in these circuits by reducing the package resistance and reducing inductance. This integration not only helps the transient voltage regulation, but may also improve power density and system efficiency.

Figure 2:
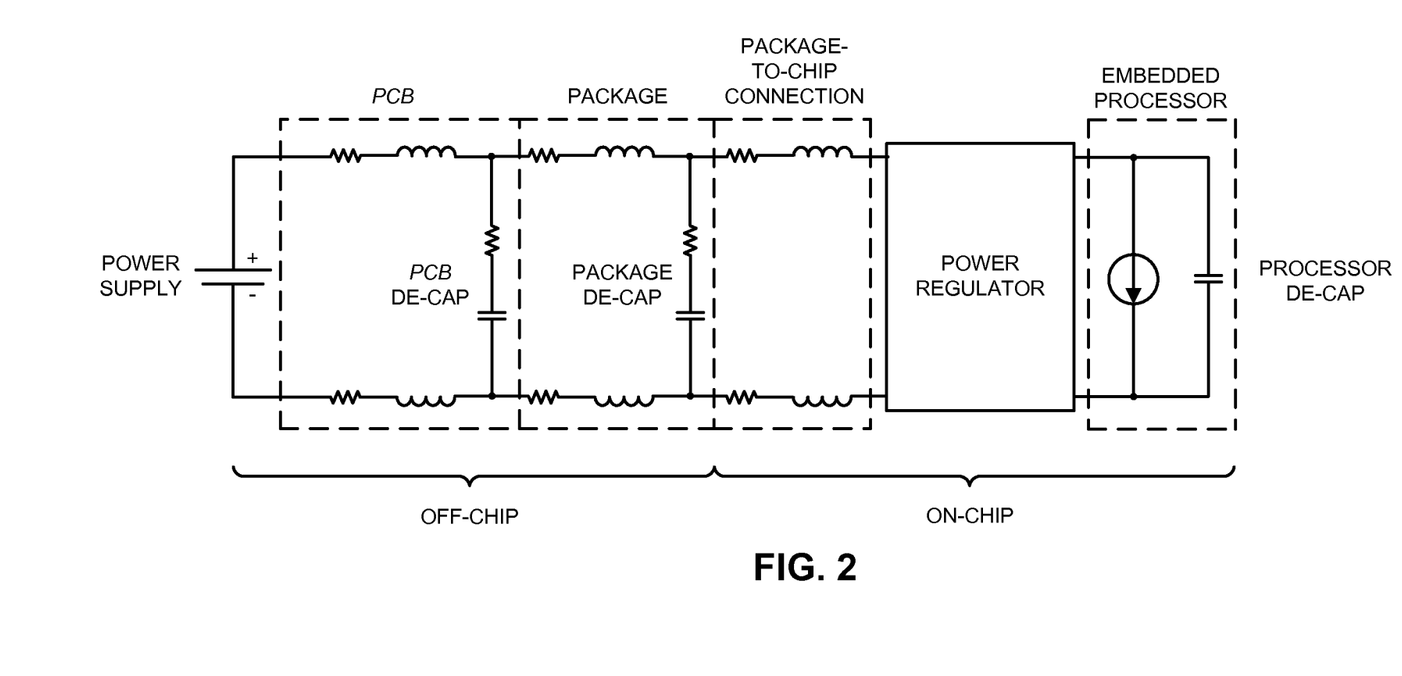
FIG. 2 is a block diagram illustrating a voltage-regulation technique for use with a processor in accordance with an embodiment of the present disclosure.

An illustration of such a configuration is shown in FIG. 2, which presents a block diagram illustrating a voltage-regulation technique for use with a processor. In this voltage-regulation technique, the transient VRM is in close proximity to the processor die. In conventional approaches, the VRM is usually placed on the PCB adjacent to the processor using bump soldering. However, this approach often results in large parasitics and will not, therefore, satisfactorily address the first-droop problem at high frequencies. An alternative approach is to place the transient VRM in the processor package itself. However, because of multiple challenges (such as the mismatch in the coefficient of thermal expansion with low-k dielectrics, mechanical stress, etc.), it can be very difficult to place the transient VRM and the processor in the same package using bump solder. Consequently, conventional organic buildup substrates and high-performance ceramic substrates are no longer able to support co-integration of silicon chips with processor chips.

Figure 3:
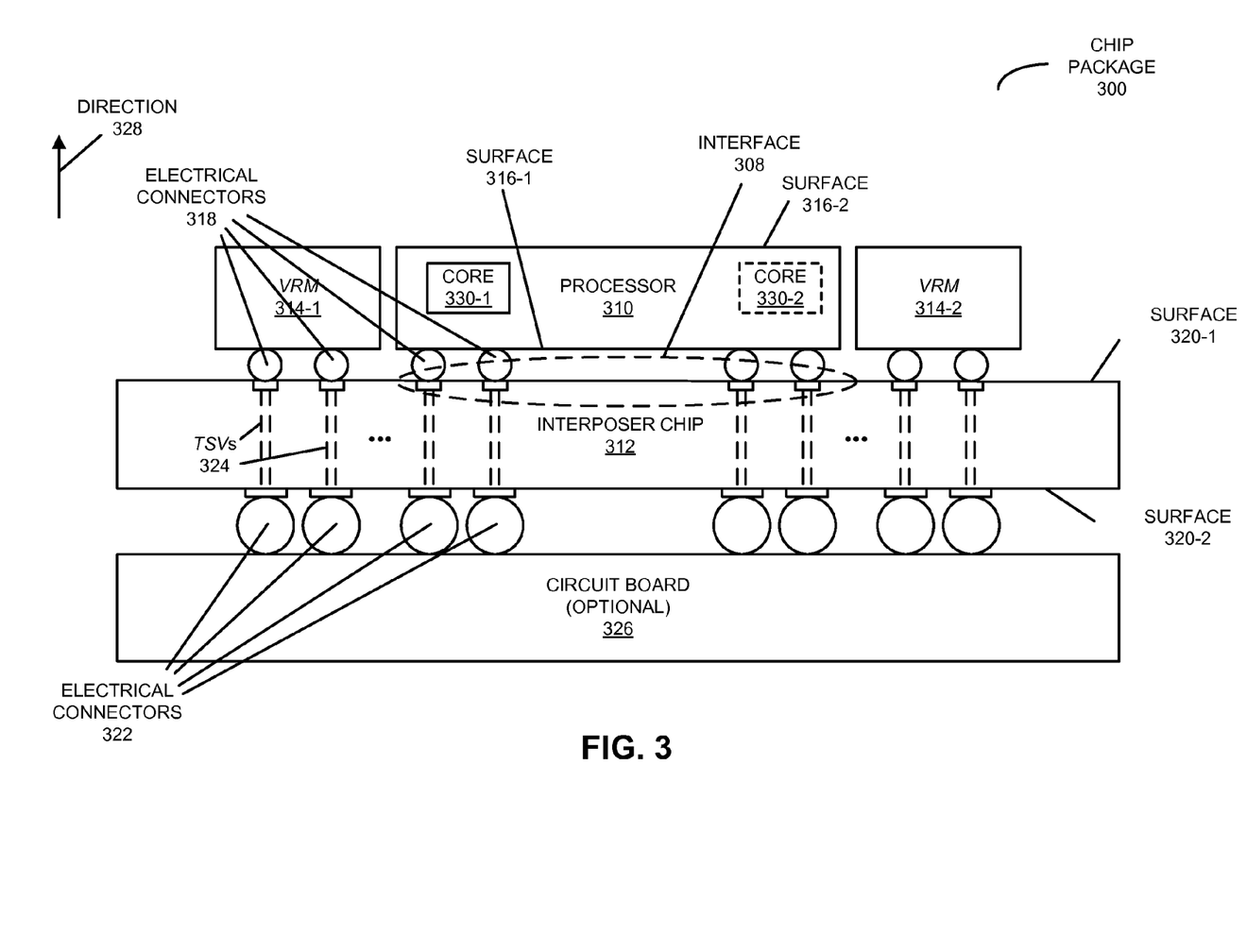
FIG. 3 is a block diagram illustrating a chip package in accordance with an embodiment of the present disclosure.

An alternative implementation to address transient voltage regulation and power delivery is shown in FIG. 3, which presents a block diagram illustrating a chip package 300. This chip package includes a processor 310, which includes processor core 330-1 and can include one or more additional processor cores, e.g., processor core 330-2. Chip package 300 also includes an interposer chip 312 and one or more VRMs 314 (such as a transient VRM, which may be separate or distinct from one or more VRMs that provide average power to processor 310). Interposer chip 312 is electrically coupled to a surface 316-1 of processor 310 by electrical connectors 318 (such as C4 solder balls, an anisotropic conducting film and/or mechanically compliant spring connectors) in interface 308, which is proximate to surface 320-1 of interposer chip 312. Moreover, interposer chip 312 includes electrical connectors 322 (such as a BGA, an LGA, an anisotropic conducting film and/or mechanically compliant spring connectors) proximate to surface 320-2 of interposer chip 312. Furthermore, interposer chip 312 includes built-in redistribution layers (RDLs), as well as 3-dimensional TSVs 324 (such as plated copper) electrically coupling electrical connectors 318 to electrical connectors 322, thereby conveying electrical signals from surface 320-2 to surface 320-1 (and vice versa).

Additionally, the one or more VRMs 314 are electrically coupled to processor 310 by interposer chip 312, and are proximate to processor 310 in chip package 300, thereby reducing voltage droop. In particular, the one or more VRMs 314 are electrically coupled to metal traces (such as those in an RDL) on or proximate to surface 320-1 of interposer chip 312, and the one or more VRMs 314 are adjacent to processor 310.

Relative to traditional chip-to-substrate or chip-to-PCB packaging, solutions, interposer chip 312 (with 3-dimensional TSVs 324) can have significantly higher input/output densities. This can result in reduced size, lower power consumption and improved functionality. Moreover, an interposer chip 312 with TSVs 324 can: provide a high wiringdensity interconnection by matching the pitches of the pads on processor 310 with pads on surface 320-1; minimize mismatch in the coefficient of thermal expansion to the copper or a low-k chip that is vulnerable to thermal-mechanical stress; and improve electrical performance by reducing the length of interconnects from processor 310 to one or more VRMs 314 (which allows one or more VRMs 314 to be placed very close to processor 310).

Note that a locally positioned transient VRM can supply charge on demand. In particular, active charge delivery from such a transient VRM can supply brief high-energy bursts at the right time by: locally sampling a transient event, reacting almost instantaneously (on the order of 1 ns or less); and engaging high-speed silicon-germanium charge injectors. In addition, electrical coupling of the one or more VRMs 314 to lower layers in interposer chip 312 using TSVs 324 also facilitates: sensing of transients, drawing power and intelligent regulation management.

Interposer chip 312 can also provide low-resistance RDL traces from the one or more VRMs 314 to power and ground connections to the processor bump site. This can facilitate traces or connections with low-parasitic resistances and minimal voltage droop that typically cannot be obtained with traces on either PCB or first-level organic and ceramic substrates. Moreover, interposer chip 312 can provide low-profile bumps that are compatible with chip-to-chip bumping, as opposed to the larger diameter chip-to-package bumps. Because the inductance of the bumps increases with the bump diameter, the smaller profile bumps in chip package 300 have lower inductances that can minimize the local switching transient swings.

Thus, chip package 300 can provide very small parasitics and can manage the first droop to achieve clean and efficient power delivery to processor 310.

In some embodiments, interposer chip 312 is a passive device that excludes integrated active circuits. Moreover, interposer chip 312 may include: a semiconductor substrate (such as silicon), a ceramic material, an organic material, a plastic material and/or a PCB.

Moreover, electrical connectors 322 can electrically couple interposer chip 312 to an optional circuit board 326. For example, optional circuit board 326 may include: an organic substrate, a ceramic substrate, glass, a PCB and/or a plastic material.

Note that electrical connectors 318 and/or 322 may provide mechanical compliance greater than a predefined value in a direction 328 perpendicular to surfaces 316 and/or 320. For example, the mechanical compliance may allow a displacement along direction 328 of 1-10 nm.

In some embodiments, the chip package includes a distributed array of transient VRMs. One or more of these transient VRMs may regulate the power for each transient-inducing circuit block (such as each processor core) on a large processor die. For example, for purposes of load balancing, one or more processor cores may be turned on or off at various times depending on processor activity, job resourcing/scheduling, or to mitigate the effects of hot spots when one or more localized processor-core regions become too hot because of thermal loading. As a consequence, the transients specific to each processor core may need to be managed separately or independently from one another.

In these embodiments, the power delivered to a subset of the processor cores may be controlled by an associated local transient VRM. Consequently, a distributed array of transient VRMs adjacent to the processor die may independently address the voltage-regulation and power-injection needs of a subset of processor cores independently.

Figure 4:
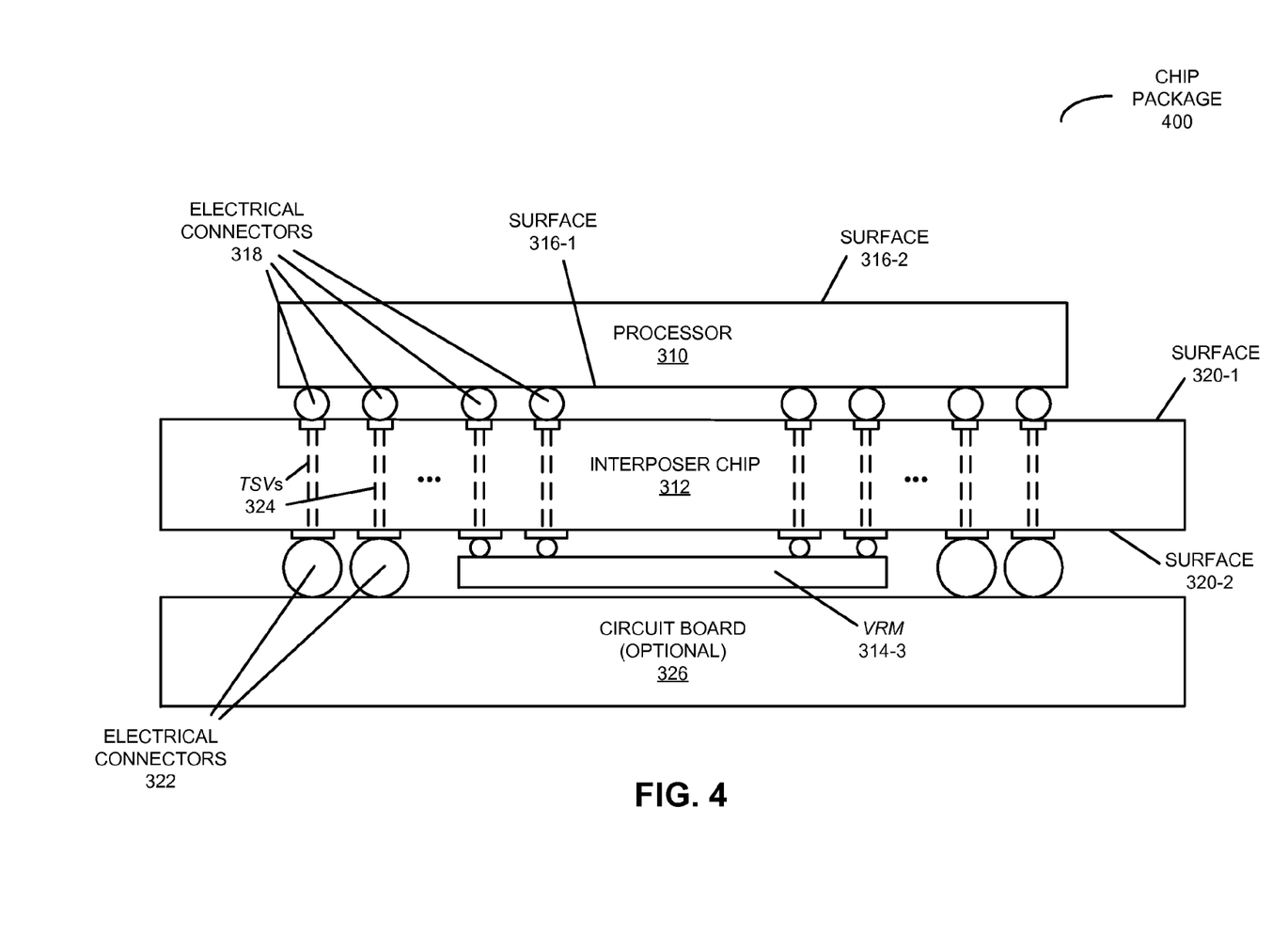
FIG. 4 is a block diagram illustrating a chip package in accordance with an embodiment of the present disclosure.

While FIG. 3 illustrates the one or more VRMs 314 on the same side of interposer chip 312 as processor 310, in other embodiments these components may be on opposite sides or surfaces 320 of interposer chip 312. This is shown in FIG. 4, which presents a block diagram illustrating a chip package 400. In particular, the one or more VRMs 314 may be electrically coupled to surface 320-2 of interposer chip 312, and thus the one or more VRMs 314 are electrically coupled to processor 310 using TSVs 324. Note that, to facilitate this configuration, the thickness of the one or more VRMs 314 may be reduced or the one or more VRMs 314 may be placed in recessed negative features or wells (not shown) in interposer chip 312.

Figure 5:
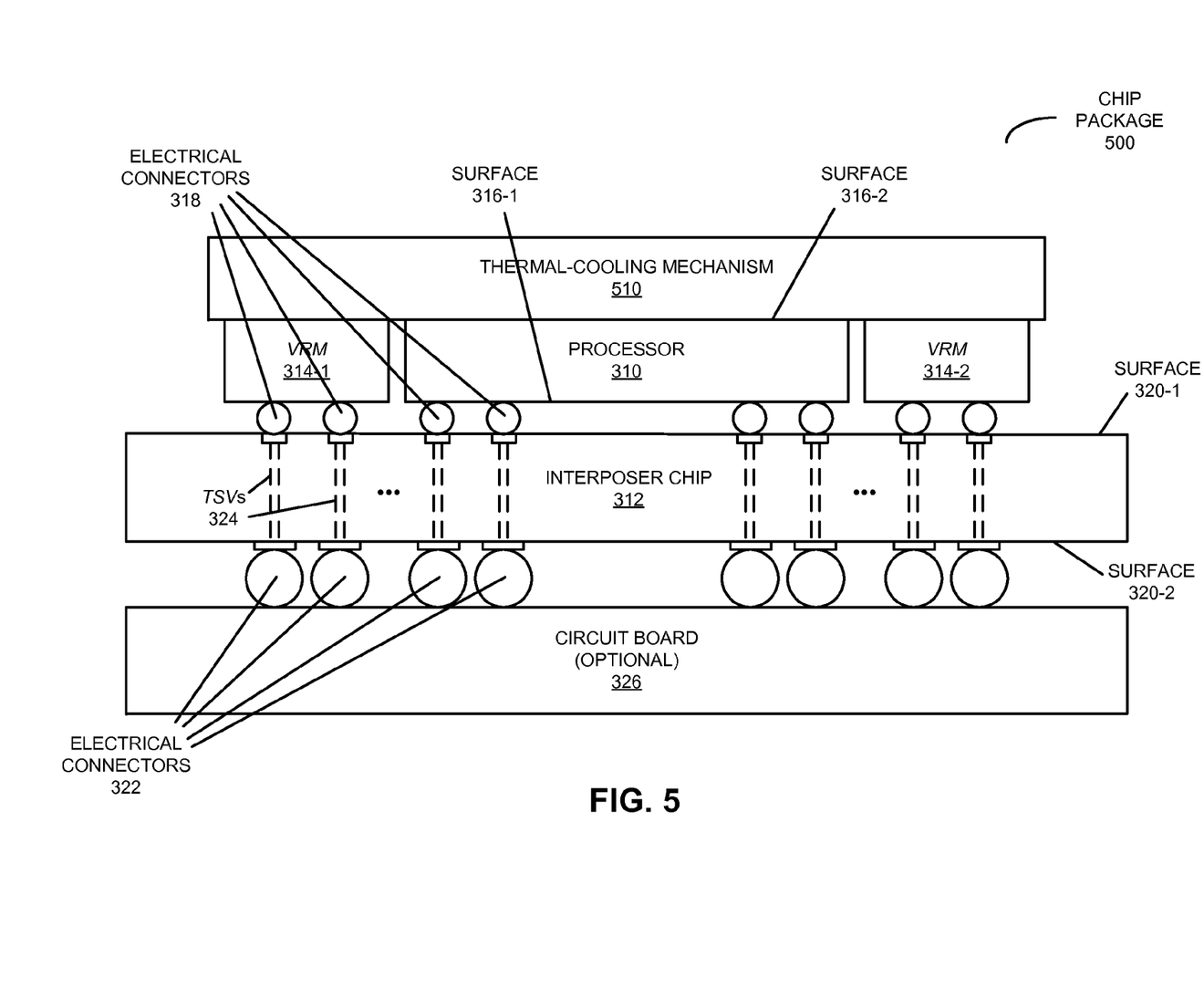
FIG. 5 is a block diagram illustrating a chip package in accordance with an embodiment of the present disclosure.

The chip-on-chip configuration enabled by interposer chip 312 also may allow for an integrated cooling solution because the transient VRMs and processor chips can maintain co-planarity and can minimize the vertical gaps, misorientation tilts and package undulations that often plague multi-chip solutions on organic or ceramic-based sockets in a planar-geometry solution. This is shown in FIG. 5, which presents a block diagram illustrating a chip package 500. In particular, chip package 500 includes a thermal-cooling mechanism 510 thermally coupled to a surface 316-2 of processor 310.

In an exemplary embodiment, interposer chip 312 has a thickness of 400 μm, and TSVs 324 have a diameter between 30-50 μm and a pitch of 180 μm.

Figure 6:
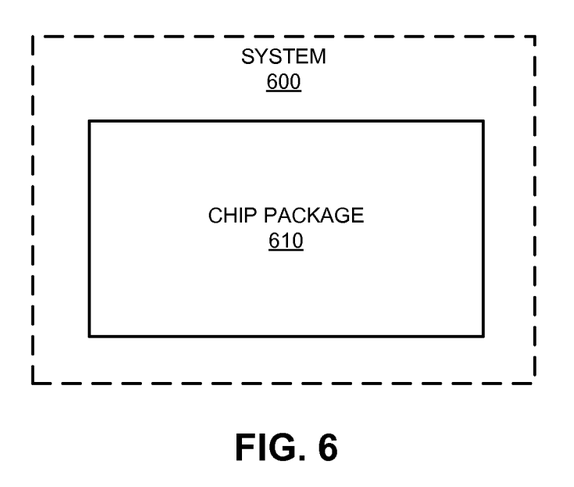
FIG. 6 is a block diagram of a system that includes a chip package in accordance with an embodiment of the present disclosure.

We now describe embodiments of the system. FIG. 6 presents a block diagram of a system 600 (such as an electronic device) that includes a chip package 610, such as chip package 300 (FIG. 3), chip package 400 (FIG. 4) and/or chip package 500 (FIG. 5).

Embodiments of chip package 610 may be used in a variety of applications, including: VLSI circuits, communication systems (such as in wavelength division multiplexing), storage area networks, data centers, networks (such as local area networks), and/or computer systems (such as multiple-core processor computer systems). For example, chip package 610 may be included in a backplane that is coupled to multiple processor blades, or chip package 610 may couple different types of components (such as processors, memory, input/output devices, and/or peripheral devices). In some embodiments, chip package 610 performs the functions of: a switch, a hub, a bridge, and/or a router.

Note that system 600 may include, but is not limited to: a server, a laptop computer, a communication device or system, a personal computer, a work station, a mainframe computer, a blade, an enterprise computer, a data center, a portable-computing device, a tablet computer, a cellular telephone, a supercomputer, a network-attached-storage (NAS) system, a storage-area-network (SAN) system, and/or another electronic computing device. Moreover, note that a given computer system may be at one location or may be distributed over multiple, geographically dispersed locations.

Chip package 300 (FIG. 3), chip package 400 (FIG. 4), chip package 500 (FIG. 5), and/or system 600 may include fewer components or additional components. Furthermore, although these embodiments are illustrated as having a number of discrete items, these chip packages and systems are intended to be functional descriptions of the various features that may be present rather than structural schematics of the embodiments described herein. Consequently, in these embodiments two or more components may be combined into a single component, and/or a position of one or more components may be changed.

Note that the interposer chip may be fabricated using an additive process (i.e., a material-deposition process) and/or a subtractive process (i.e., a material-removal process). For example, the process may include: sputtering, plating, isotropic etching, anisotropic etching, a photolithographic technique and/or a direct-write technique. Additionally, these processes may utilize a wide variety of materials, including: a semiconductor, metal, glass, sapphire, an organic material, a ceramic material, a plastic and/or silicon dioxide.

In general, during assembly components in the chip packages may be positioned relative to each other, and mechanically coupled to each other, using a flip-chip process and/or a pick-and-place process. Furthermore, the mechanical coupling between the interposer chip and the processor in these embodiments may be rigid (such as that associated with glue or reflowed solder) or may be rematable to facilitate re-work of chip packages.

Figure 7:
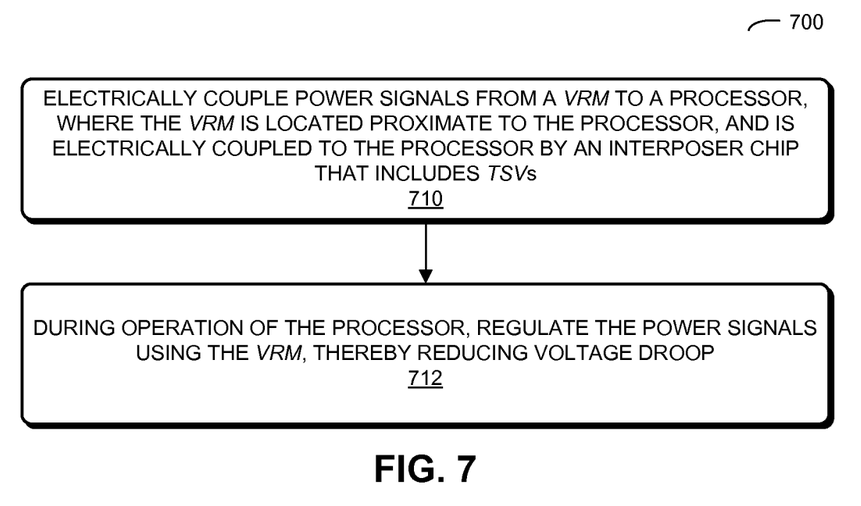
FIG. 7 is a flow chart illustrating a method for regulating power to a processor in accordance with an embodiment of the present disclosure.

We now describe embodiments of the method. FIG. 7 presents a flow chart illustrating a method 700 for regulating power to a processor. During the method, power signals are electrically coupled from the VRM to the processor (operation 710). This VRM is located proximate to the processor in the chip package, and is electrically coupled to the processor by the interposer chip that includes TSVs between the first electrical connectors on the first surface of the interposer chip and the second electrical connectors on the second surface of the interposer chip. Moreover, the second electrical connectors can electrically couple the interposer chip to a circuit board. Then, during operation of the processor, the power signals supplied to the processor may be regulated using the VRM (operation 712), thereby reducing the voltage droop.

In some embodiments of method 700, there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
    a processor that includes multiple processor cores;
    an interposer chip electrically coupled to a first surface of the processor by first electrical connectors proximate to a first surface of the interposer chip, wherein the first electrical connectors are on top of the first surface of the interposer chip, wherein the interposer chip includes second electrical connectors proximate to a second surface of the interposer chip, wherein the interposer chip includes through-substrate vias (TSVs) electrically coupling the first electrical connectors to the second electrical connectors, wherein the second electrical connectors are configured to electrically couple the interposer chip to a circuit board, and wherein the processor is electrically coupled to the circuit board by using a first connector from the first electrical connectors, a second connector from the second electrical connectors, and a TSV in the TSVs that electrically connects the first connector to the second connector; and
    a voltage regulator module (VRM) electrically coupled to the processor by the interposer chip, wherein the VRM is proximate to the processor in the chip package, thereby reducing voltage droop, and wherein the VRM includes an array of VRMs, each VRM in the array configured to regulate power to a corresponding subset of the multiple processor cores independently from power regulation to processor cores of the multiple processor cores that are not in the corresponding subset.

2. The chip package of claim 1, wherein the VRM is electrically coupled to the first surface of the interposer chip; and wherein the VRM is adjacent to the processor.

3. The chip package of claim 1, further comprising the circuit board electrically coupled to the second electrical connectors.

4. The chip package of claim 3, wherein the circuit board includes at least one of an organic substrate or a ceramic substrate.

5. The chip package of claim 1, wherein the VRM includes a transient VRM.

6. The chip package of claim 1, wherein the interposer chip includes a semiconductor substrate.

7. The chip package of claim 1, wherein the interposer chip is a passive device that excludes integrated active circuits.

8. The chip package of claim 1, wherein each of the first electrical connectors is entirely on top of the first surface of the interposer chip, wherein each of the second electrical connectors is entirely below the second surface, and wherein each of the TSVs is substantially perpendicular to the first surface and the second surface.

9. The chip package of claim 8, wherein the VRM is electrically coupled to the circuit board by using a third connector from the first electrical connectors, a fourth connector from the second electrical connectors, and a TSV in the TSVs that electrically connects the third connector to the fourth connector.

10. The chip package of claim 8, wherein the processor sits on top of the first electrical connectors.

11. The chip package of claim 1, wherein connections of the processor to the circuit board comprise only a set of straight-thru connections that each uses a corresponding one of first electrical connectors, a corresponding one of the second electrical connectors, and a corresponding one of the TSVs, wherein the corresponding one of the TSVs electrically connects the corresponding one of first electrical connectors to the corresponding one of the second electrical connectors, and wherein the corresponding one of the TSVs is substantially perpendicular to the first surface and the second surface.

12. A system, comprising a chip package, wherein the chip package includes:
    an interposer chip having an interface that is configured to electrically couple to a first surface of a processor using first electrical connectors proximate to a first surface of the interposer chip, wherein the first electrical connectors are on top of the first surface of the interposer chip, wherein the interposer chip includes second electrical connectors proximate to a second surface of the interposer chip, wherein the interposer chip includes through-substrate vias (TSVs) electrically coupling the first electrical connectors to the second electrical connectors, wherein the second electrical connectors are configured to electrically couple the interposer chip to a circuit board, and wherein the processor is electrically coupled to the circuit board by using a first connector from the first electrical connectors, a second connector from the second electrical connectors, and a TSV in the TSVs that electrically connects the first connector to the second connector; and a voltage regulator module (VRM) configured to be electrically coupled to the processor by the interposer chip, wherein the VRM is proximate to the interface in the chip package, thereby reducing voltage droop, wherein the processor includes multiple processor cores, an wherein the VRM includes an array of VRMs, each VRM in the array configured to regulate power to a corresponding subset of the multiple processor cores independently from power regulation to processor cores of the multiple processor cores that are not in the corresponding subset.

13. The system of claim 12, wherein the VRM is electrically coupled to the first surface of the interposer chip; and wherein the VRM is adjacent to the interface.

14. The system of claim 12, further comprising the circuit board electrically coupled to the second electrical connectors.

15. The system of claim 12, wherein the VRM includes a transient VRM.

16. The system of claim 12, wherein the interposer chip includes a semiconductor substrate.

17. The system of claim 12, wherein the interposer chip is a passive device that excludes integrated active circuits.

18. A method for regulating power to a processor that includes multiple processor cores, wherein the method comprises:

electrically coupling a voltage regulator module (VRM) to the processor by providing power signals from the VRM to the processor, wherein the VRM includes an array of VRMs and is located proximate to the processor in a chip package, wherein the VRM is electrically coupled to the processor by an interposer chip that includes TSVs between first electrical connectors on a first surface of the interposer chip and second electrical connectors on a second surface of the interposer chip, wherein the second electrical connectors are configured to electrically couple the interposer chip to a circuit board, wherein the first electrical connectors are on top of the first surface of the interposer chip, and wherein the processor is electrically coupled to the circuit board by using a first connector from the first electrical connectors, a second connector from the second electrical connectors, and a TSV in the TSVs that electrically connects the first connector to the second connector; and during operation of the processor, regulating power supplied to the processor by using each VRM in the array to regulate power to corresponding subset of the multiple processor cores independently from power regulation to processor cores of the mutiple processor cores that are not in the corresponding subset.

\* \* \* \* \*

UNITED STATES PATENT AND TRADEMARK OFFICE
CERTIFICATE OF CORRECTION

PATENT NO.         : 8,982,563 B2
APPLICATION NO.    : 13/171072
DATED              : March 17, 2015
INVENTOR(S)        : Kannan Raj et al.

Page 1 of 1

It is certified that error appears in the above-identified patent and that said Letters Patent is hereby corrected as shown below:

Specification

At column 4, line 3, delete the term "10-20x" and replace it with the following: -- 10x - 20x --

At column 5, line 49, delete the term "1-10nm." and replace it with the following: -- 1-10 μm. --

Claims

In claim 12 (at column 9, line 10) delete the word "an" and replace it with the word -- and --

In claim 18 (at column 10, line 23) delete the word "to" and insert in its place the words -- to a --

In claim 18 (at column 10 line 25) delete "mutiple" and replace it with the word -- multiple --

Signed and Sealed this
Twelfth Day of April, 2016

Michelle K. Lee
*Director of the United States Patent and Trademark Office*